US011164791B2

(12) United States Patent
Wu et al.

(10) Patent No.: US 11,164,791 B2
(45) Date of Patent: Nov. 2, 2021

(54) CONTACT FORMATION FOR STACKED VERTICAL TRANSPORT FIELD-EFFECT TRANSISTORS

(71) Applicant: International Business Machines Corporation, Armonk, NY (US)

(72) Inventors: Heng Wu, Guilderland, NY (US); Tenko Yamashita, Schenectady, NY (US); Chen Zhang, Albany, NY (US); Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 16/283,995

(22) Filed: Feb. 25, 2019

(65) Prior Publication Data

US 2020/0273755 A1 Aug. 27, 2020

(51) Int. Cl.
*H01L 21/8234* (2006.01)
*H01L 21/768* (2006.01)
*H01L 21/822* (2006.01)
*H01L 27/088* (2006.01)

(52) U.S. Cl.
CPC ........... *H01L 21/823475* (2013.01); *H01L 21/76816* (2013.01); *H01L 21/76877* (2013.01); *H01L 21/8221* (2013.01); *H01L 21/823487* (2013.01); *H01L 27/088* (2013.01); *H01L 21/76843* (2013.01)

(58) Field of Classification Search
CPC ......... H01L 21/76843; H01L 21/76816; H01L 21/76877; H01L 21/76897; H01L 21/8221; H01L 21/823475; H01L 21/823871; H01L 21/823481; H01L 21/823885; H01L 27/0688; H01L 29/41741; H01L 29/66666; H01L 29/7827; H01L 29/78642
See application file for complete search history.

(56) References Cited

U.S. PATENT DOCUMENTS

| | | |
|---|---|---|
| 8,021,947 B2 | 9/2011 | Grivna et al. |
| 8,354,342 B2 | 1/2013 | Oh et al. |
| 8,637,912 B1 | 1/2014 | Park |
| 8,883,596 B2 | 11/2014 | Cheong et al. |
| 9,093,524 B2 | 7/2015 | Oh et al. |
| 9,257,553 B2 | 2/2016 | Lee |

(Continued)

*Primary Examiner* — David C Spalla
(74) *Attorney, Agent, or Firm* — Erik Johnson; Ryan, Mason & Lewis, LLP

(57) ABSTRACT

A method of forming a semiconductor structure includes forming a stacked vertical transport field-effect transistor (VTFET) structure including one or more vertical fins each including a first semiconductor layer providing a vertical transport channel for a lower VTFET, an isolation layer, and a second semiconductor layer providing a vertical transport channel for an upper VTFET. The method also includes forming at least one vertical via in the stacked VTFET structure spaced apart from the one or more vertical fins. The method further includes forming at least one horizontal via extending from the vertical via to at least one source/drain region of at least one of the upper and lower VTFETs. The method further includes forming a contact liner in the horizontal via, forming a barrier layer on sidewalls of the vertical via and the contact liner, and forming a contact material over the barrier layer in the vertical via.

20 Claims, 13 Drawing Sheets

(56) References Cited

U.S. PATENT DOCUMENTS

| | | | |
|---|---|---|---|
| 9,680,473 B1 | 6/2017 | Anderson et al. | |
| 9,824,933 B1 | 11/2017 | Pawlak | |
| 9,831,131 B1 * | 11/2017 | Jacob | H01L 29/66439 |
| 10,192,867 B1 * | 1/2019 | Frougier | H01L 29/66545 |
| 10,297,513 B1 * | 5/2019 | Yamashita | H01L 29/6656 |
| 2005/0073051 A1 * | 4/2005 | Yamamoto | H01L 21/02063 |
| | | | 257/758 |
| 2012/0135573 A1 | 5/2012 | Kim | |
| 2012/0208364 A1 | 8/2012 | Rouh et al. | |
| 2014/0030859 A1 * | 1/2014 | Xie | B82Y 10/00 |
| | | | 438/199 |
| 2017/0005106 A1 * | 1/2017 | Zhang | H01L 29/7926 |

* cited by examiner

100

200

300

400

500

600

700

900

1000

1100

1200

CONTACT FORMATION FOR STACKED VERTICAL TRANSPORT FIELD-EFFECT TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming contacts in stacked vertical transport field-effect transistors.

In one embodiment, a method of forming a semiconductor structure comprises forming a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. The method also comprises forming at least one vertical via in the stacked vertical transport field-effect transistor structure, the at least one vertical via being spaced apart from the one or more vertical fins of the stacked vertical transport field-effect transistor structure. The method further comprises forming at least one horizontal via extending from the at least one vertical via to at least one source/drain region of at least one of the upper and lower vertical transport field-effect transistors of the stacked vertical transport field-effect transistor structure. The method further comprises forming a contact liner in the at least one horizontal via, forming a barrier layer on sidewalls of the at least one vertical via and on sidewalls of the contact liner, and forming a contact material over the barrier layer in the at least one vertical via.

In another embodiment, a semiconductor structure comprises a stacked vertical transport field-effect transistor comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. The semiconductor structure also comprises at least one vertical via in the stacked vertical transport field-effect transistor, the at least one vertical via being spaced apart from the one or more vertical fins of the stacked vertical transport field-effect transistor. The semiconductor structure further comprises at least one horizontal via extending from the at least one vertical via to at least one source/drain region of at least one of the upper and lower vertical transport field-effect transistors of the stacked vertical transport field-effect transistor structure, a contact liner disposed in the at least one horizontal via, a barrier layer disposed on sidewalls of the contact liner and the at least one vertical via, and a contact material disposed over the barrier layer in the at least one vertical via.

In another embodiment, an integrated circuit comprises a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. The stacked vertical transport field-effect transistor structure also comprises at least one vertical via spaced apart from the one or more vertical fins, at least one horizontal via extending from the at least one vertical via to at least one source/drain region of at least one of the upper and lower vertical transport field-effect transistors, a contact liner disposed in the at least one horizontal via, a barrier layer disposed on sidewalls of the contact liner and the at least one vertical via, and a contact material disposed over the barrier layer in the at least one vertical via.

DETAILED DESCRIPTION

Figure 1:
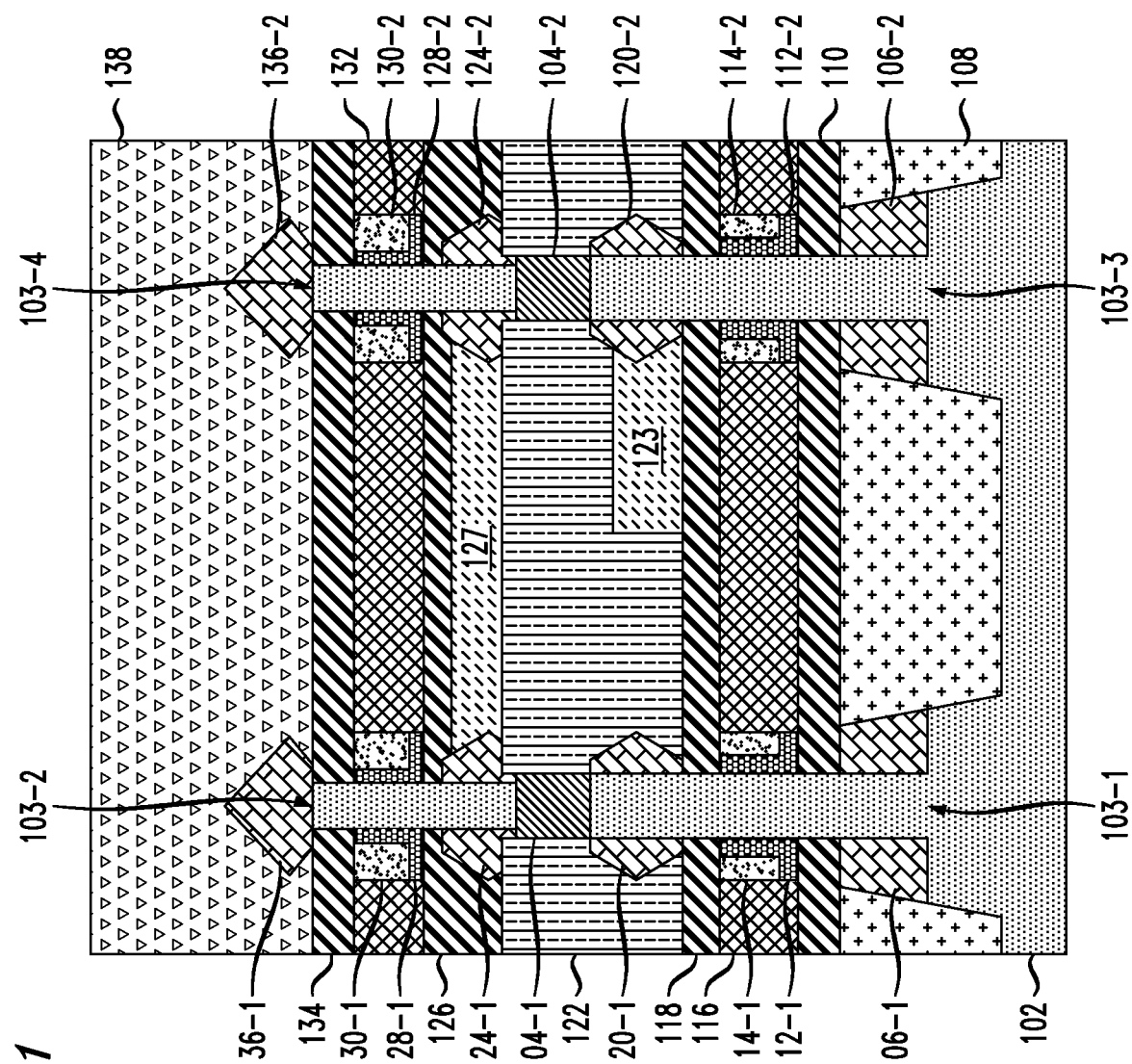
FIG. 1 depicts a cross-sectional view of a stacked vertical transport field-effect transistor structure, according to an embodiment of the invention.

Illustrative embodiments of the invention may be described herein in the context of illustrative methods for forming contacts in stacked vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 5 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration.

Stacking VTFETs may provide further advantages in reducing the area and enabling a denser circuit layout. Due to the vertical integration nature of vertically stacked VTFETs, however, the middle-of-line (MOL) metal connection to the VTFET devices is very challenging. Illustrative embodiments provide contact metallization processes for stacked VTFETs to enable improved metal fill and lower MOL contact and stud resistance. To do so, some embodiments use a contact line pinch-off to realize a metal stud of MOL metals in the horizontal direction. Some embodiments may further etch back the contact liner and re-fill with low resistive material in "super" via trenches that extend into the stacked VTFET structure as will be described in further detail below.

FIG. 1 shows a cross-sectional view 100 of a stacked VTFET structure prior to formation of "super" via trenches to form MOL contacts. The stacked VTFET structure of FIG. 1 includes a substrate 102 and vertical fins 103-1, 103-2, 103-3 and 103-4 (collectively, vertical fins 103) formed over the substrate 102. The vertical fins 103-1 and 103-2 are separated by a first isolation layer 104-1, and the vertical fins 103-3 and 103-4 are separated by a second isolation layer 104-2. The first and second isolation layers 104-1 and 104-2 (collectively, isolation layers 104) may be formed from a same starting layer.

The vertical fins 103 provide vertical transport channels for respective VTFETs. The vertical fin 103-1 provides a vertical transport channel for a first "lower" VTFET, the vertical fin 103-2 provides a vertical transport channel for a first "upper" VTFET, the vertical fin 103-3 provides a vertical transport channel for a second "lower" VTFET, and the vertical fin 103-4 provides a vertical transport channel for a second "upper" VTFET.

In some embodiments, the vertical fins 103 provide vertical transport channels for a same type of VTFET (e.g., one of nFETs and pFETs). In other embodiments, different ones of the vertical fins 103 provide vertical transport channels for different types of VTFETs. For example, the vertical fins 103-1 and 103-2 may provide vertical transport channels for one of nFET and pFET VTFETs, while the vertical fins 103-3 and 103-4 provide vertical transport channel for the other one of nFET and pFET VTFETs. As another example, the vertical fins 103-1 and 103-3 (e.g., for the "lower" VTFETs) may provide vertical transport channels for one of nFET and pFET VTFETs while the vertical fins 103-2 and 103-4 (e.g., for the "upper" VTFETs) provide vertical transport channels for the other one of nFET and pFET VTFETs. Various other combinations are possible.

As illustrated in FIG. 1, the vertical fins 103-1 and 103-3 have a first, wider thickness (in direction X-X') for the lower VTFETs and the vertical fins 103-2 and 103-4 have a second, narrower thickness (in direction X-X') for the upper VTFETs. In some embodiments the horizontal width or thickness (in direction X-X') of the vertical fins 103-1 and 103-3 for the lower VTFETs is in the range of 5 to 12 nm and the horizontal width or thickness (in direction X-X') of the vertical fins 103-2 and 103-4 for the upper VTFETs is in the range of 4 to 10 nm. The height or vertical thickness (in direction Y-Y') of the vertical fins 103-1 and 103-3, as measured from a top surface of the substrate 102, may be in the range of 30 to 70 nm. The height or vertical thickness (in direction Y-Y') of the vertical fins 103-2 and 103-4, as measured from a top surface of the isolation layers 104, may be in the range of 30 to 70 nm.

The substrate 102 and vertical fins 103 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

In some embodiments, the starting structure includes the substrate 102, the isolation layer 104 and an additional semiconductor layer (e.g., which provides material for the vertical fins 103-2 and 103-4). The vertical fins 103 may be formed using sidewall image transfer (SIT) or other suitable techniques such as lithography and etching including reactive-ion etching (ME), etc. This may involve patterning a hard mask layer (e.g., formed of a nitride such as silicon nitride (SiN)) over the additional semiconductor layer and then etching down to form all of the vertical fins 103 in a single etching step. In other embodiments, the lower VTFETs may be formed first, followed by deposition of the isolation layer 104 and then subsequent formation of the upper VTFETs.

The isolation layer 104 may be formed of an insulating material such as silicon dioxide ($SiO_2$), SiN, silicon oxycarbide (SiOC), etc. The isolation layer 104 may have a height or vertical thickness (in direction Y-Y') in the range of 10 to 20 nm.

Although FIG. 1 shows an example where just two sets of vertical fins are formed (e.g., vertical fins 103-1 and 103-2, and vertical fins 103-3 and 103-4), it should be appreciated that more or fewer than two sets of vertical fins may be formed depending on the desired number of VTFETs for the resulting structure. In addition, while FIG. 1 illustrates stacking just two VTFETs, it should be appreciated that three or more VTFETs may be stacked on top of one another.

The FIG. 1 structure further includes bottom source/drain regions 106-1 and 106-2 (collectively, bottom source/drain regions 106) for the lower VTFETs. The bottom source/drain regions 106 surround a portion of the sidewalls of the vertical fins 103-1 and 103-3 as illustrated. The bottom source/drain regions 106 may have a height or vertical thickness (in direction Y-Y') in the range of 15 to 30 nm. The bottom source/drain regions 106 may have a width or horizontal thickness (in direction X-X') in the range of 40 to 60 nm.

The bottom source/drain regions 106 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 110 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The bottom/source drain regions 106 are surrounded by a shallow trench isolation (STI) layer 108. The STI layer 108 may have a height or vertical thickness (in direction Y-Y') in the range of 50 to 400 nm.

A bottom spacer 110 for the lower VTFETs is formed surrounding a portion of the vertical fins 103-1 and 103-2 above the bottom source/drain regions 106 and the STI layer 108. The bottom spacer 110 may be formed using various processing, such as non-conformal deposition and etch-back processing (e.g., physical vapor deposition (PVD), high density plasma (HDP) deposition, etc.). The bottom spacer 110 may be formed of a dielectric material such as $SiO_2$, SiN, silicon carbide oxide (SiCO), silicon boron carbide nitride (SiBCN), etc. The bottom spacer 110 may have a height or vertical thickness (in direction Y-Y') in the range of 3 to 10 nm.

Above the bottom spacer 110, a gate stack for the lower VTFETs is formed. The gate stack includes gate dielectric layers 112-1 and 112-2 (collectively, gate dielectric layers 112) and gate conductor layers 114-1 and 114-2 (collectively, gate conductor layers 114).

The gate dielectric layers 112 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layers 112 may have a uniform thickness in the range of 1 nm to 3 nm.

The gate conductor layers 114 may include a metal gate or work function metal (WFM). In some embodiments, the gate conductor layers 114 are formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired. The gate conductor layers 114 may have a horizontal width or thickness (in direction X-X') in the range of 5 to 20 nm.

The gate stack (e.g., the gate dielectric layers 112 and gate conductor layers 114 may collectively have a height or vertical thickness (in direction Y-Y') in the range of 10 to 30 nm on vertical sidewalls of the vertical fins 103-1 and 103-3.

An interlayer dielectric (ILD) 116 is then formed surrounding the gate stack for the lower VTFETs. The ILD 116 may be formed of any suitable isolation material, such as $SiO_2$, SiOC, SiON, etc.

Top spacer 118 for the lower VTFETs is formed surrounding a portion of the vertical sidewalls of the vertical fins 103-1 and 103-3 above the ILD 116. The top spacer 118 may be formed of similar materials and with similar sizing as that described above with respect to bottom spacer 110.

Top source/drain regions 120-1 and 120-2 (collectively, top source/drain regions 120) of the lower VTFETs are formed over the top spacer 118 and surrounding the remaining portion of the vertical sidewalls of the vertical fins 103-1 and 103-3. The top source/drain regions 120 may be formed of similar materials and with similar processing as that described above with respect to bottom source/drain regions 106. The top source/drain regions 120 may have a height or vertical thickness (in direction Y-Y') in the range of 10 to 30 nm, and may have a width or horizontal thickness (in direction X-X') in the range of 5 to 15 nm.

The isolation layers 104 are formed between the top surfaces of the vertical fins 103-1 and 103-3 and the bottom surfaces of the vertical fins 103-2 and 103-4 as illustrated.

An isolation or ILD layer 122 surrounds the top source/drain regions 120 and isolation layers 104. The ILD layer 122 may be formed of similar materials as those described above with respect to ILD 116, and may have a height or vertical thickness (in direction Y-Y') in the range of 20 to 40 nm.

As illustrated, a sacrificial layer 123 is formed adjacent a portion of the top source/drain region 120-2. The sacrificial layer 123 may be formed prior to formation of the ILD layer 122. For example, the sacrificial material may be first deposited uniformly across the structure, followed by patterning until the sacrificial material remains only in the desired region (e.g., the area shown in FIG. 1).

The sacrificial material of the sacrificial layer 123 comprises a material that may be etched selective to the materials of layers 122, 126, 132, 134 and 138. In some embodiments, the layers 122, 126, 132, 134 and 138 are formed of nitride or oxide materials, and the sacrificial material of sacrificial layer 123 may comprise a material that can be etched selective to nitride and oxide materials, such as amorphous silicon (a-Si), amorphous carbon (a-C), silicon oxycarbide (SiCO), etc.

As will be described in further detail below, the sacrificial layer 123 is removed during later processing to form a contact to the top source/drain region 120-2. It is assumed, in this example, that the resulting VTFET structure provides a NAND gate. For a NAND gate, the super vertical via formed as described below and the horizontal vias or tunnels which extend from the super vertical via are for the output node of the NAND gate, and thus is a shared contact for the top source/drain region 120-2 of one of the lower VTFETs and the bottom source/drain regions 124-1 and 124-2 (collectively, bottom source/drain regions 124) of the upper VTFETs.

The bottom source/drain regions 124 are formed over the ILD layer 122 and surrounding a portion of the vertical sidewalls of the vertical fins 103-2 and 103-4. The bottom source/drain regions 124 may be formed of similar materials and with similar processing as that described above with respect to bottom source/drain regions 106. The bottom source/drain regions 124 may have a height or vertical thickness (in direction Y-Y') in the range of 10 to 30 nm, and may have a width or horizontal thickness (in direction X-X') in the range of 5 to 15 nm.

Bottom spacer 126 is formed surrounding the bottom source/drain regions 124 and a portion of the vertical sidewalls of the vertical fins 103-2 and 103-4 above top surface of the bottom source/drain regions 124. The bottom spacer 126 may be formed of similar materials as the bottom spacer 110. The bottom spacer 126 may have a height or vertical thickness (in direction Y-Y') in the range of 10 to 30 nm, provided that the bottom spacer 126 must be formed with a greater height than that of the bottom source/drain regions 124 so as to provide a buffer between the bottom source/drain regions 124 and the gate stack of the upper VTFETs.

Another sacrificial layer 127 is formed as illustrated. The sacrificial layer 127 may be formed using a uniform deposition process (e.g., PVD) to deposit sacrificial material followed by patterning such that that sacrificial material remains only in the desired region of sacrificial layer 127 shown in FIG. 1. The sacrificial layer 127 may be formed of similar materials as those described above with respect to sacrificial layer 123. The sacrificial layer 127 facilitates the formation of contacts to the bottom source/drain regions 124 as will be described in further detail below.

The gate stack for the upper VTFETs is formed surrounding a portion of the vertical sidewalls of the vertical fins 103-2 and 103-4 above the bottom spacer 126. The gate stack for the upper VTFETs, similar to the gate stack for the lower VTFETs, includes gate dielectric layers 128-1 and 128-2 (collectively, gate dielectric layers 128) and gate conductor layers 130-1 and 130-2 (collectively, gate conductor layers 130). The gate dielectric layers 128 and gate conductor layers 130 may be formed of similar materials, with similar processing and similar sizing as that described above with respect to the gate dielectric layers 112 and gate conductor layers 114 of the lower VTFETs.

Although not shown in FIG. 1, an interfacial layer may be formed between the gate stacks and the sidewalls of the vertical fins 103. The interfacial layer may be formed of Sift or another suitable material such as silicon oxynitride (Si-$O_xN_y$). The interfacial layer may have a width or horizontal thickness (in direction X-X') ranging from 0.5 nm to 1.5 nm.

ILD 132 is formed surrounding the gate stack of the upper VTFETs. The ILD 132 may be formed of similar materials as that described above with respect to the ILD 116.

Top spacer 134 for the upper VTFETs is formed over the gate stack and ILD 132 surrounding portions of sidewalls of the vertical fins 103-2 and 103-4. The top spacer 134 may be formed of similar materials as the bottom spacer 110. The top spacer 134 may have a height or vertical thickness (in direction Y-Y') in the range of 10 to 30 nm.

Top source/drain regions 136-1 and 136-2 (collectively, top source/drain regions 136) are formed over the top surfaces of the vertical fins 103-2 and 103-4 as shown. The top source/drain regions 136 may be formed of similar materials and using similar processing as that described above with respect to bottom source/drain regions 106. The top source/drain regions 136 may have a height or vertical thickness (in direction Y-Y') in the range of 10 to 30 nm, and may have a width or horizontal thickness (in direction X-X') in the range of 10 to 30 nm.

ILD 138 is formed surrounding the top source/drain regions 136. The ILD 138 may be formed of similar materials as those described above with respect to the ILD 116. As shown in FIG. 1, the ILD 138 overfills the structure, and has a height or vertical thickness (in direction Y-Y') that exceeds the top surfaces of the top source/drain regions 136, such as a height or vertical thickness in the range of 30 to 70 nm.

Figure 2:
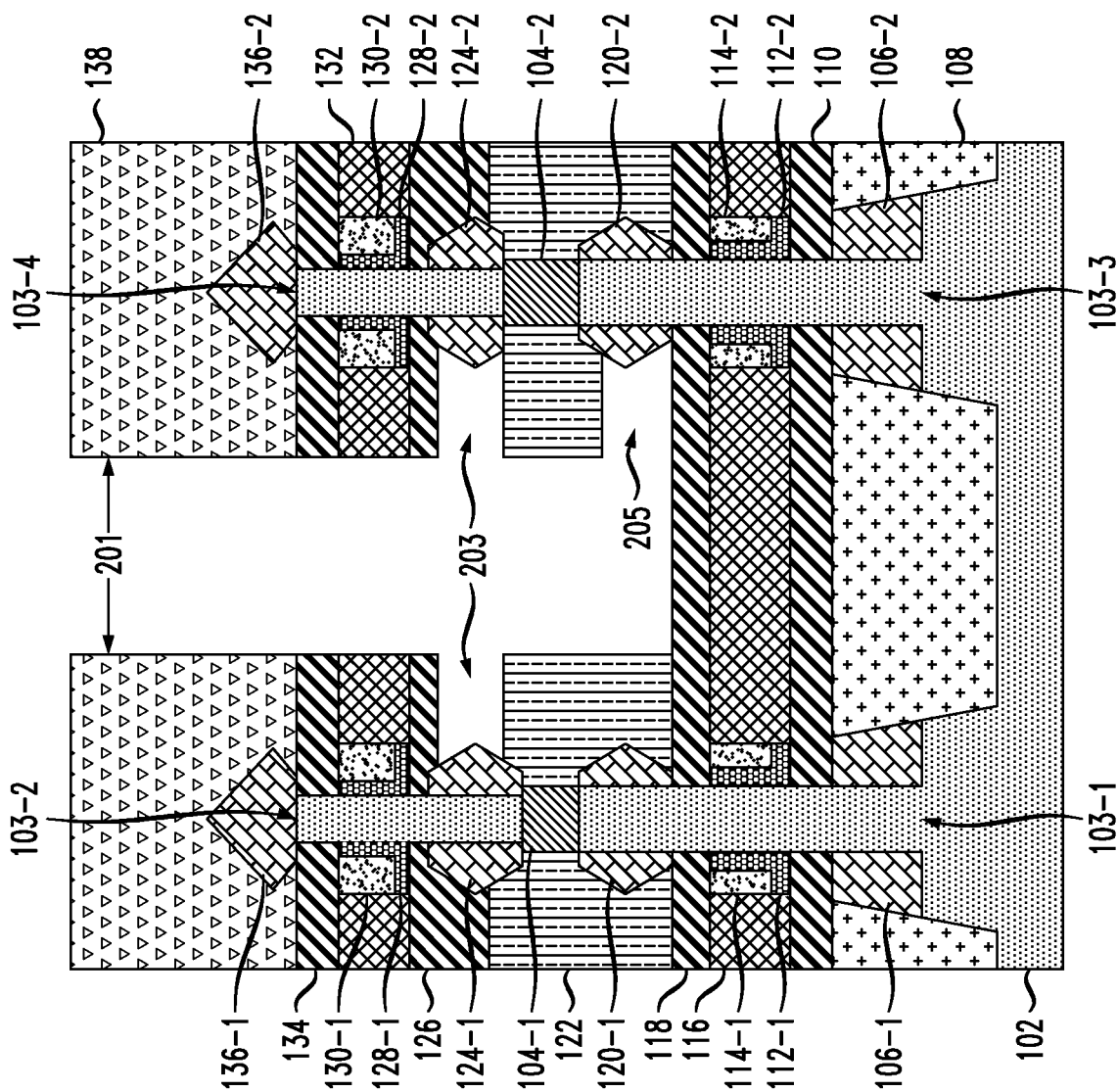
FIG. 2 depicts a cross-sectional view of the FIG. 1 structure following formation of a via and removal of sacrificial layers to expose portions of the bottom source/drain regions of the upper vertical transport field-effect transistors and to expose a top source/drain region of the one of the lower vertical transport field-effect transistors, according to an embodiment of the invention.

FIG. 2 shows a cross-sectional view 200 of the FIG. 1 structure following formation of a "super" vertical via and removal of the sacrificial layers 123 and 127 to form horizontal vias that extend from the vertical via to the bottom source/drain regions 124 and the top source/drain region 120-2. The super via may be formed by patterning a mask layer over the top surface of the ILD 138, exposing a portion of the ILD 138 (e.g., of distance 201, where the distance 201 may be in the range of 20 to 40 nm), followed by RIE or other suitable processing to remove exposed portions of the ILD layer 138, top spacer 134, ILD layer 132, sacrificial layer 127, bottom spacer 126, sacrificial layer 123 and ILD 122. Remaining portions of the sacrificial layers 127 and 123 (e.g., in regions 203 and 205) are then removed using an etch process that removes the sacrificial material of these layers selective to the materials of the layers 122, 126, 132, 134 and 138. As a result, portions of the bottom source/drain regions 124 and the top source/drain region 120-2 are exposed. In some embodiments, for example, the layers 122, 126, 132, 134 and 138 are formed of oxide and/or nitride materials, while the sacrificial material of the sacrificial layers 123 and 127 is a-Si, a-C, SiCO, etc. In such cases, the etch used to remove the remaining portions of the sacrificial layers 123 and 127 may be a selective wet etch, a non-directional dry etch, etc.

Figure 3:
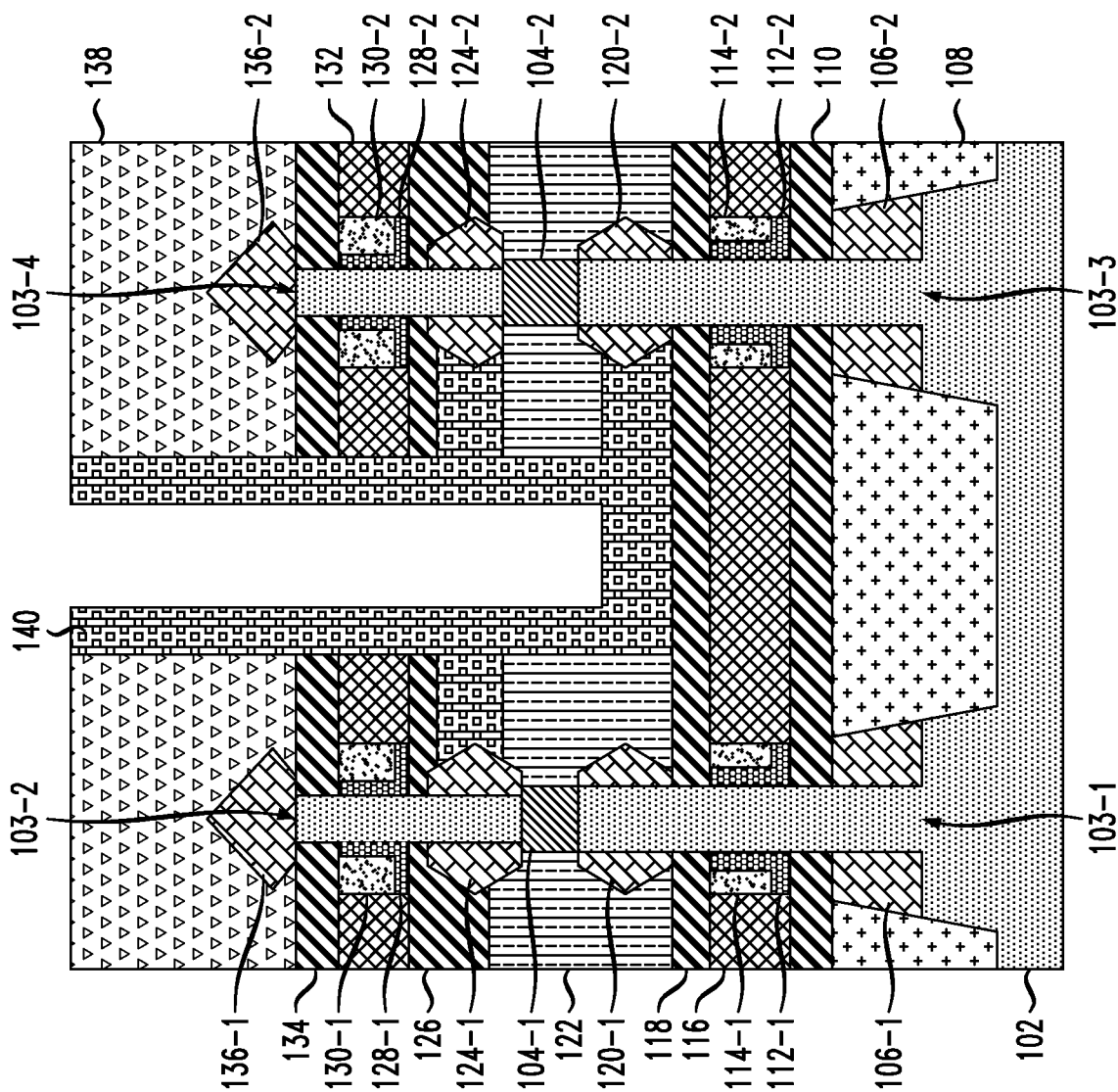
FIG. 3 depicts a cross-sectional view of the FIG. 2 structure following formation of a contact liner, according to an embodiment of the invention.

FIG. 3 shows a cross-sectional view 300 of the FIG. 2 structure following formation of a contact liner 140. The contact liner 140 may be formed using chemical vapor deposition (CVD), which pinches off the horizontal vias (e.g., spaces in regions 203 and 205) formed by removal of the sacrificial layers 123 and 127. The CVD processing may be followed by an anneal, such as rapid thermal processing (RTP), rapid thermal annealing (RTA), laser spike annealing (LSA), laser annealing, etc. The contact liner 140 may be formed of titanium (Ti), nickel (Ni), cobalt (Co), platinum (Pt), or another suitable material. The thickness of the contact liner 140 is based on the sizes of the regions 203 and 205, in that the deposition of material for the contact liner 140 continues until these regions are pinched off.

Figure 4:
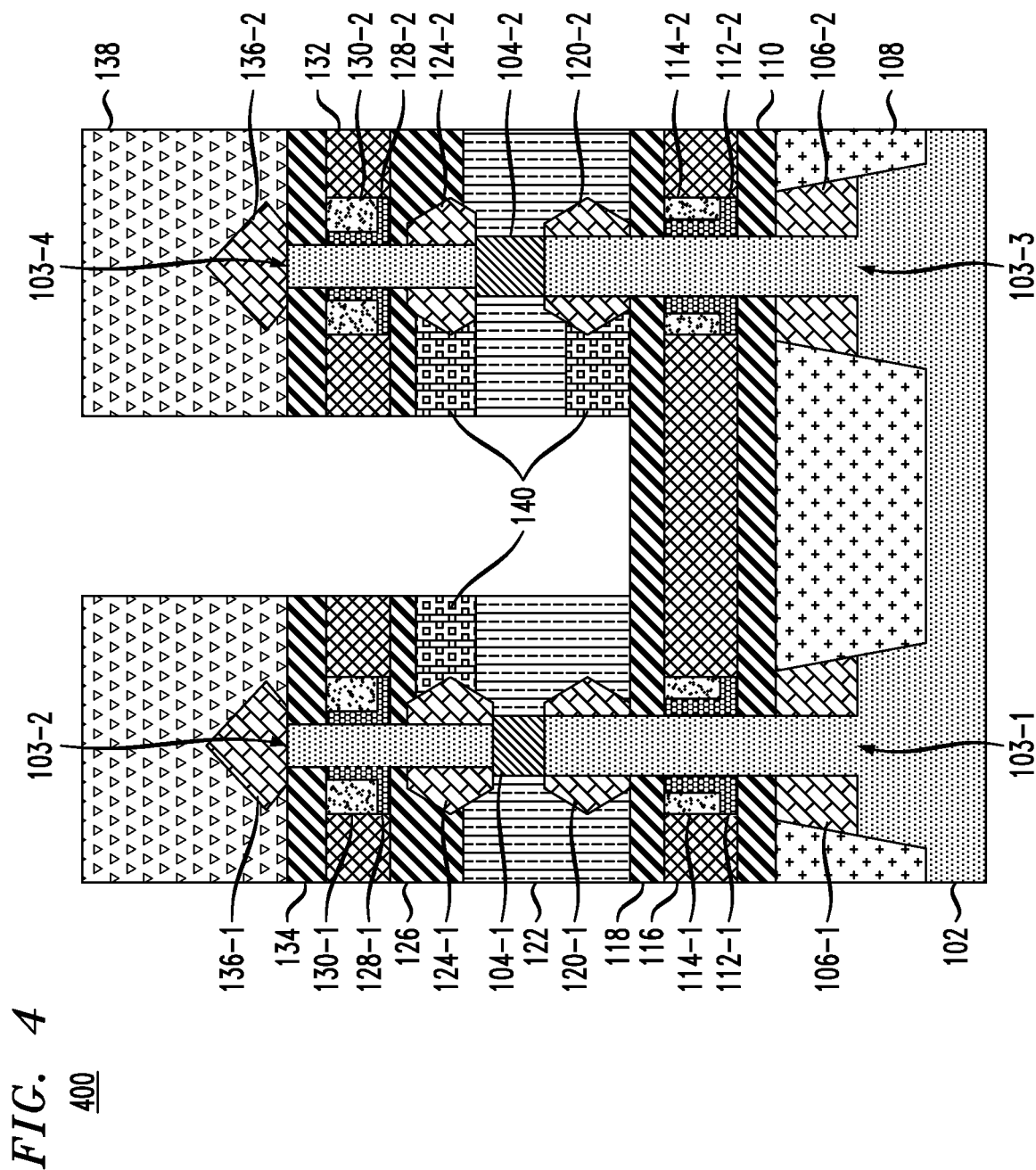
FIG. 4 depicts a cross-sectional view of the FIG. 3 structure following etch-back of the contact liner, according to an embodiment of the invention.

FIG. 4 shows a cross-sectional view 400 of the FIG. 3 structure following etch-back of the contact liner 140. The contact liner 140 may be etched back using directional RIE or other suitable processing, such that the contact liner 140 remains only in the regions 203 and 205, and not in the super via defined by opening 201.

Figure 5:
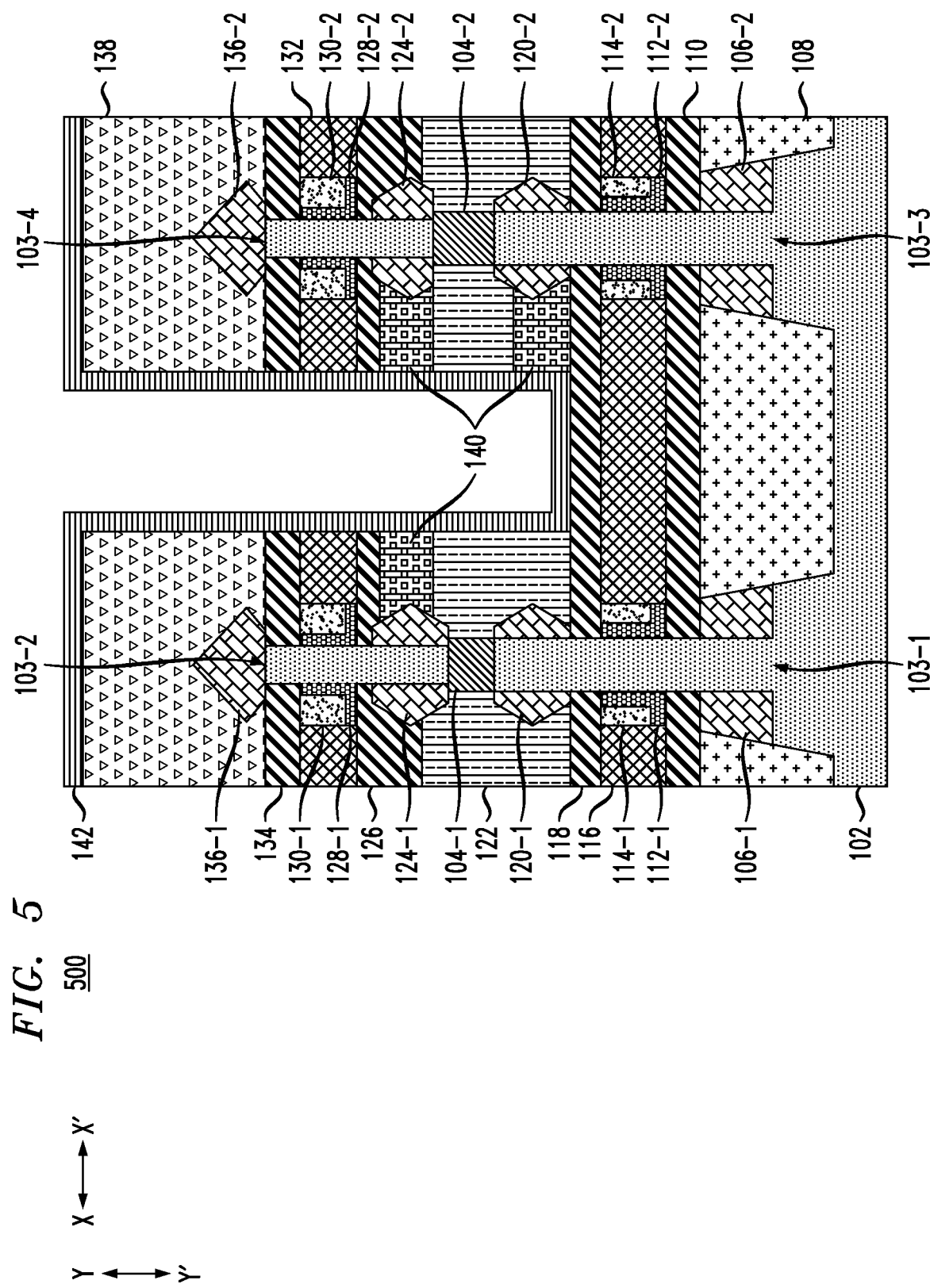
FIG. 5 depicts a cross-sectional view of the FIG. 4 structure following formation of a barrier layer, according to an embodiment of the invention.

FIG. 5 shows a cross-sectional view 500 of the FIG. 4 structure following formation of a barrier layer 142. The barrier layer 142 may be formed using a conformal deposition process such as CVD, ALD, etc. The barrier layer 142 assists with metal filling of the super via for contact formation described in further detail below. The barrier layer 142 may be formed of TiN or another suitable material such as TaN, ruthenium (Ru), etc. The barrier layer 142 may be a uniform thickness in the range of 1 to 3 nm.

Figure 6:
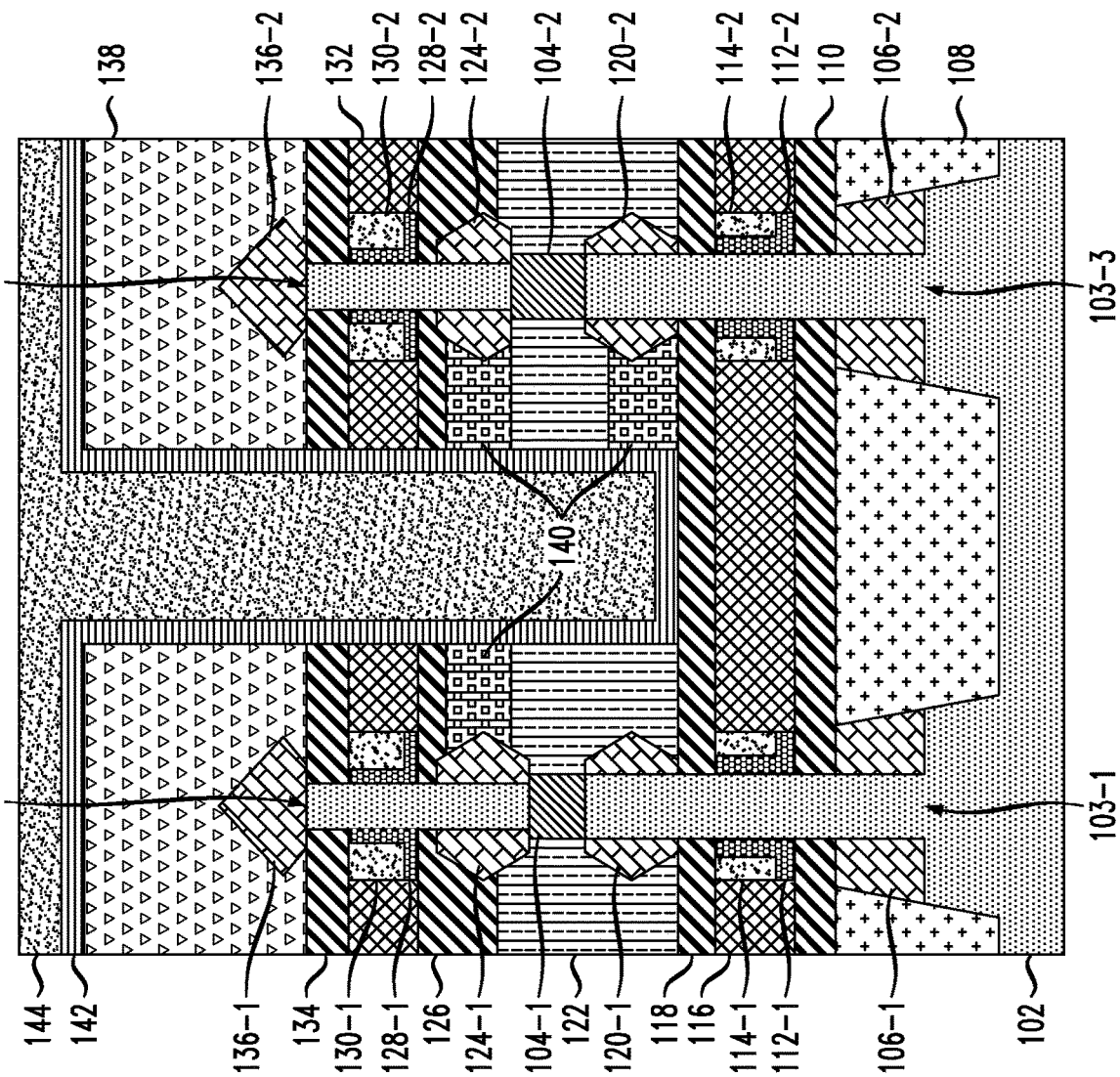
FIG. 6 depicts a cross-sectional view of the FIG. 5 structure following fill with a contact material, according to an embodiment of the invention.

FIG. 6 shows a cross-sectional view 600 of the FIG. 5 structure following fill with a contact material 144 (e.g., contact stud metal fill). The contact material 144 may be tungsten (W), cobalt (Co), or another suitable material.

Figure 7:
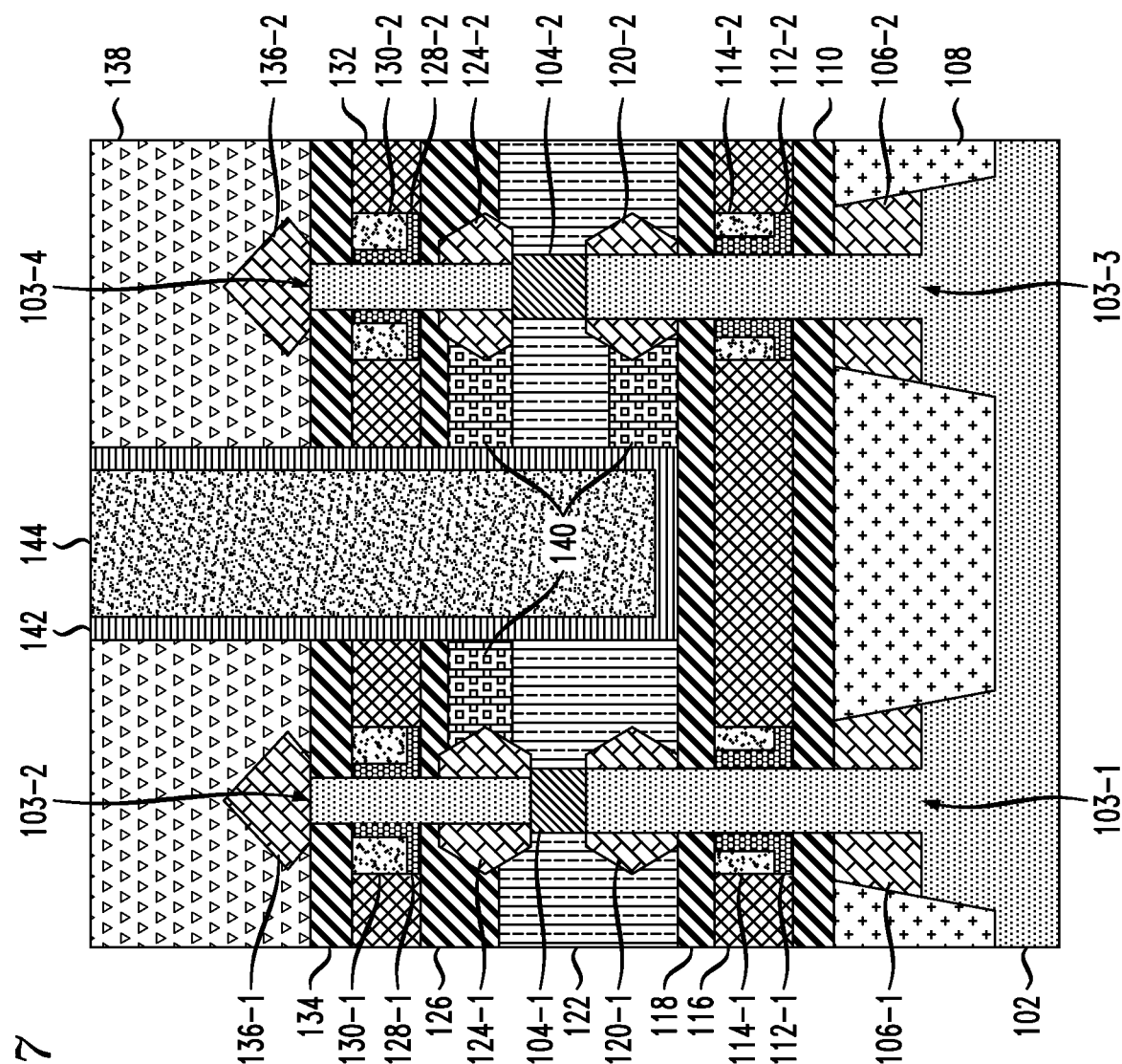
FIG. 7 depicts a cross-sectional view of the FIG. 6 structure following planarization, according to an embodiment of the invention.

FIG. 7 shows a cross-sectional view 700 of the FIG. 6 structure following planarization to remove portions of the contact material 144 and barrier layer 142 that are formed above the top surface of the ILD 138. The planarization may utilize metal chemical mechanical planarization (CMP) that stops at a top surface of the ILD 138 as illustrated.

Although FIGS. 1-7 illustrate the formation of a shared contact to the bottom source/drain regions 124 of the upper VTFETs and the top source/drain region 120-2 of one of the lower VTFETs, it should be appreciated that similar processing may be used to form contacts to other combinations of the bottom and top source/drain regions of the upper and lower VTFETs of a stacked VTFET structure. Various examples of such alternatives will now be described.

Figure 8:
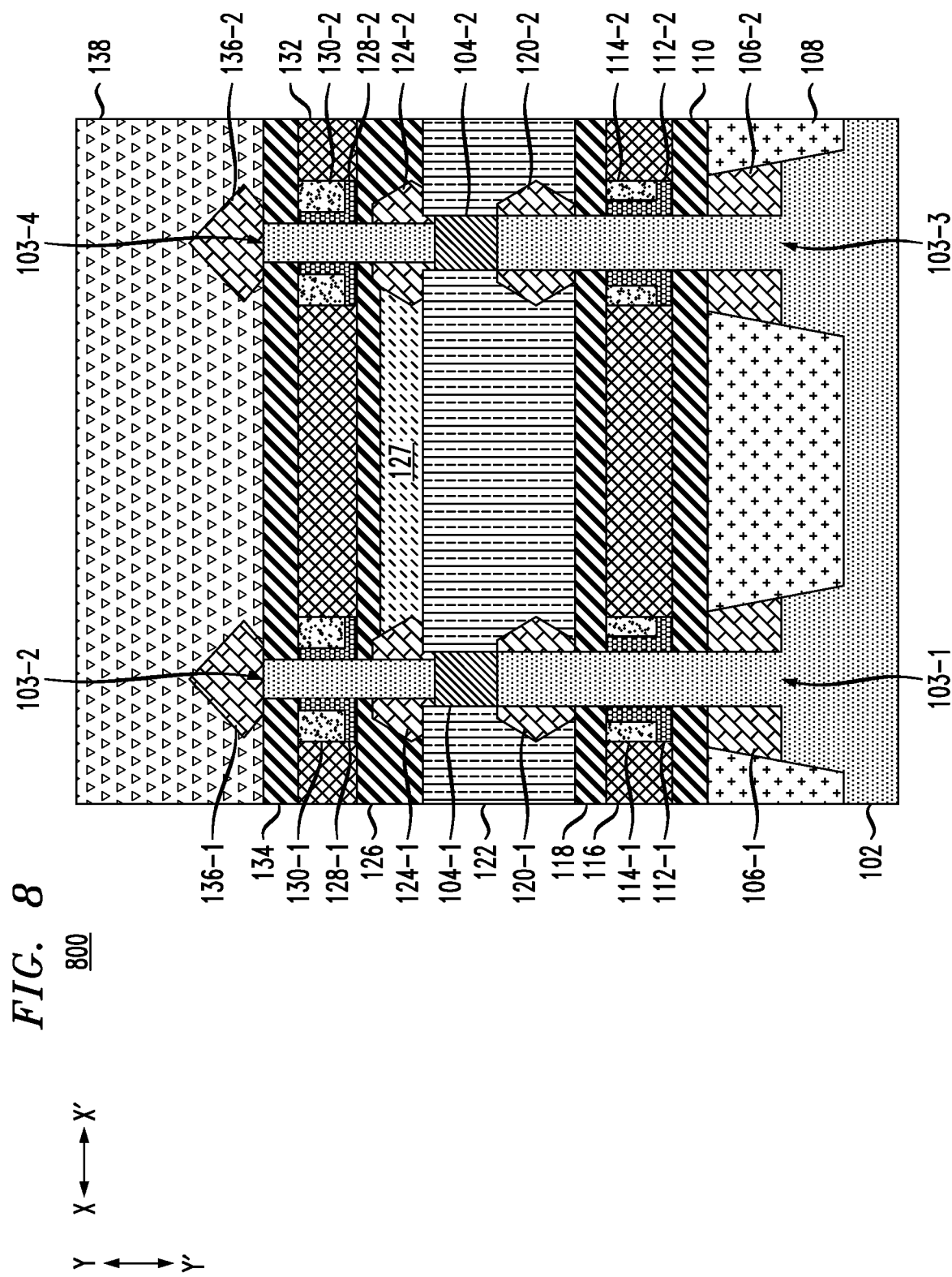
FIG. 8 depicts a cross-sectional view of another stacked vertical transport field-effect transistor structure, according to an embodiment of the invention.
Figure 9:
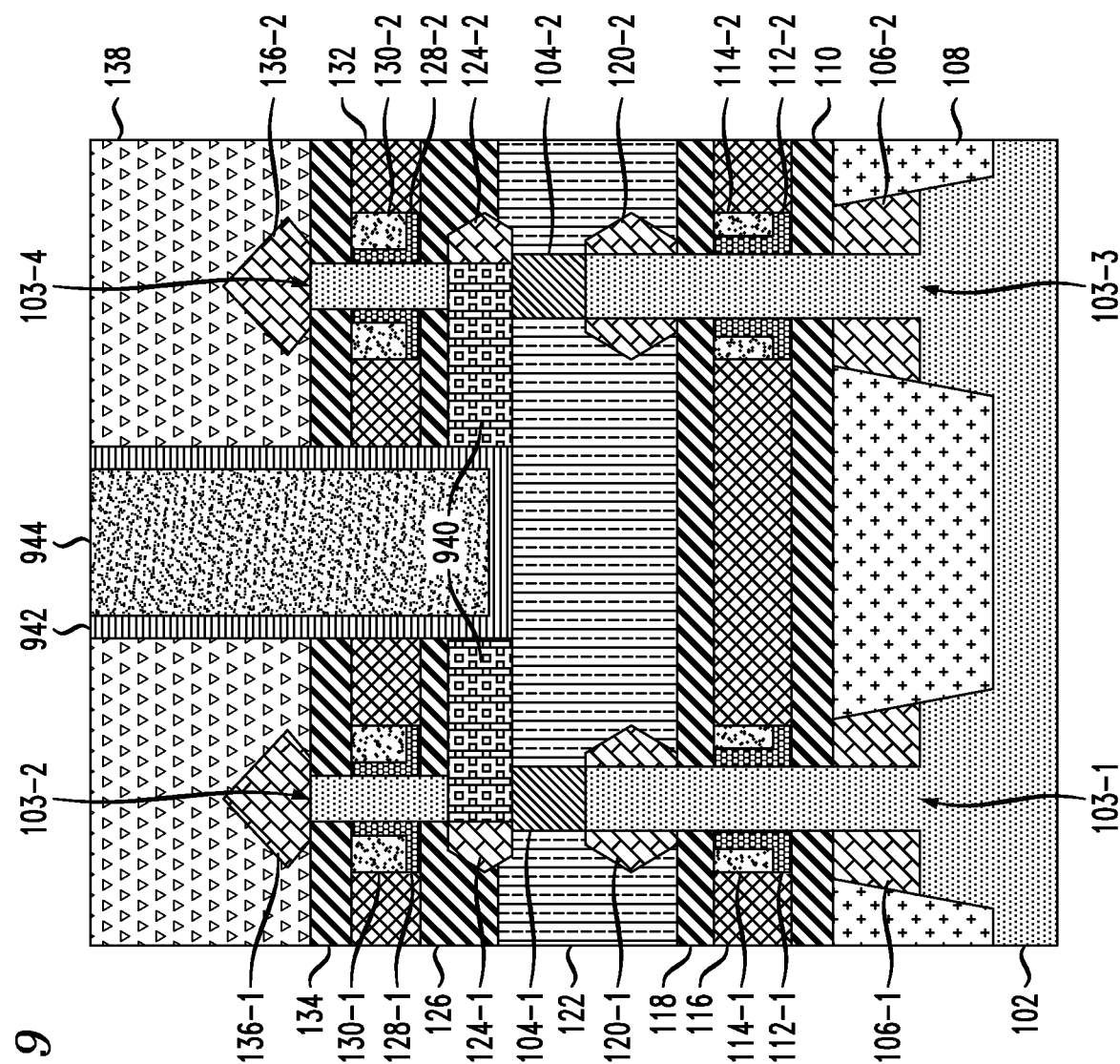
FIG. 9 depicts a cross-sectional view of the FIG. 8 structure following formation of contacts, according to an embodiment of the invention.

FIG. 8 shows a cross-sectional view 800 of a starting structure that is similar to that of FIG. 1, though the FIG. 8 structure includes only the sacrificial layer 127 and not the sacrificial layer 123. FIG. 9 shows a cross-sectional view 900 of the FIG. 8 structure after processing similar to that described above with respect to FIGS. 2-7, though in this instance the super via is only formed down to the top surface of the ILD 122, the contact liner 940 is only formed in regions 203 to contact the bottom source/drain regions 124 of the lower VTFETs, and the barrier layer 942 and contact material 944 fill the space as illustrated.

Figure 10:
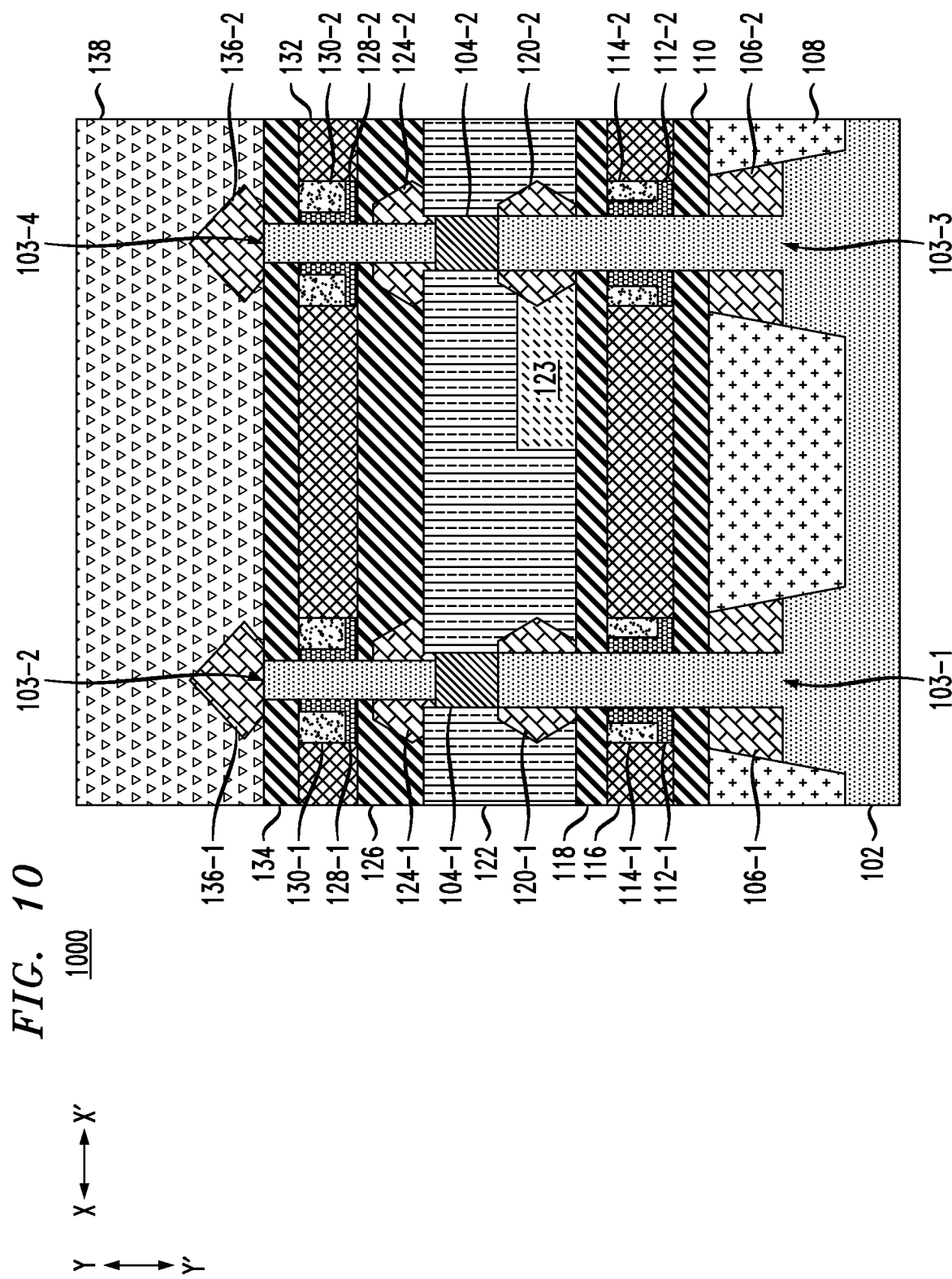
FIG. 10 depicts a cross-sectional view of another stacked vertical transport field-effect transistor structure, according to an embodiment of the invention.
Figure 11:
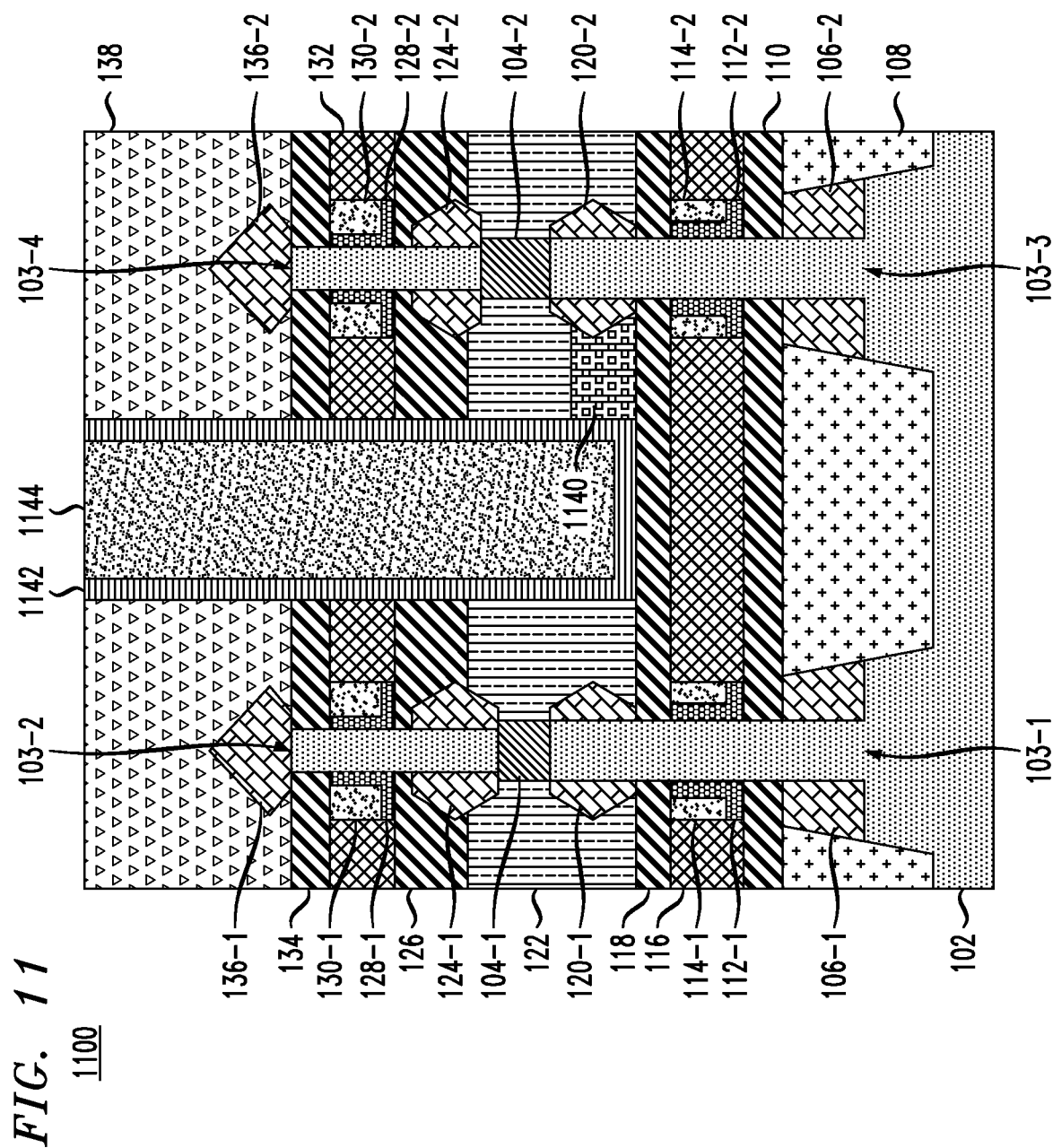
FIG. 11 depicts a cross-sectional view of the FIG. 10 structure following formation of contacts, according to an embodiment of the invention.

FIG. 10 shows a cross-sectional view 1000 of a starting structure that is similar to that of FIG. 1, though the FIG. 10 structure includes only the sacrificial layer 123 and not the sacrificial layer 127. FIG. 11 shows a cross-sectional view 1100 of the FIG. 10 structure after processing similar to that described above with respect to FIGS. 2-7, though in this instance the contact liner 1140 is only formed in region 205 to contact the top source/drain region 120-2 of one of the lower VTFETs, and the barrier layer 1142 and contact material 1144 fill the space as illustrated.

Figure 12:
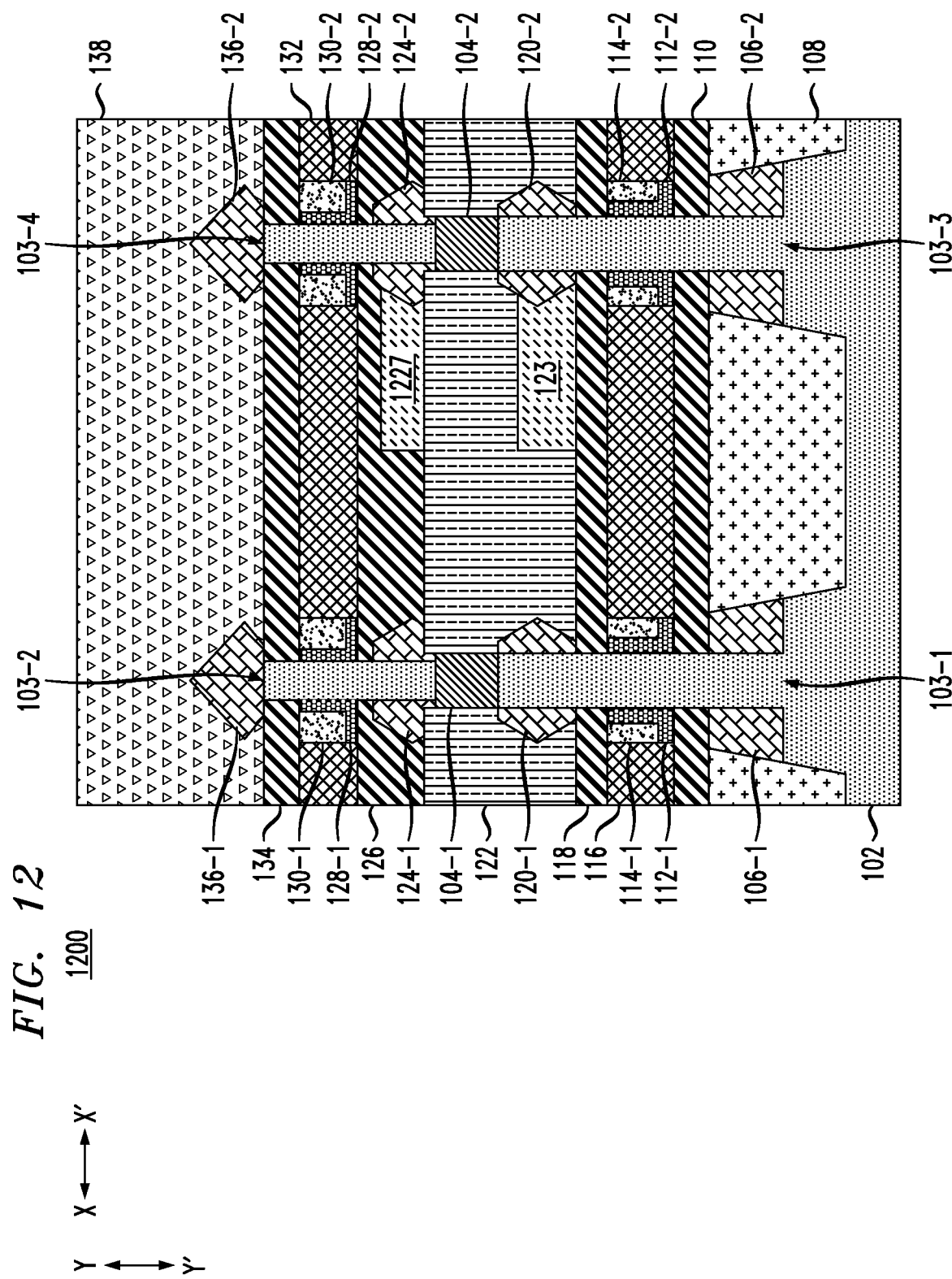
FIG. 12 depicts a cross-sectional view of another stacked vertical transport field-effect transistor structure, according to an embodiment of the invention.
Figure 13:
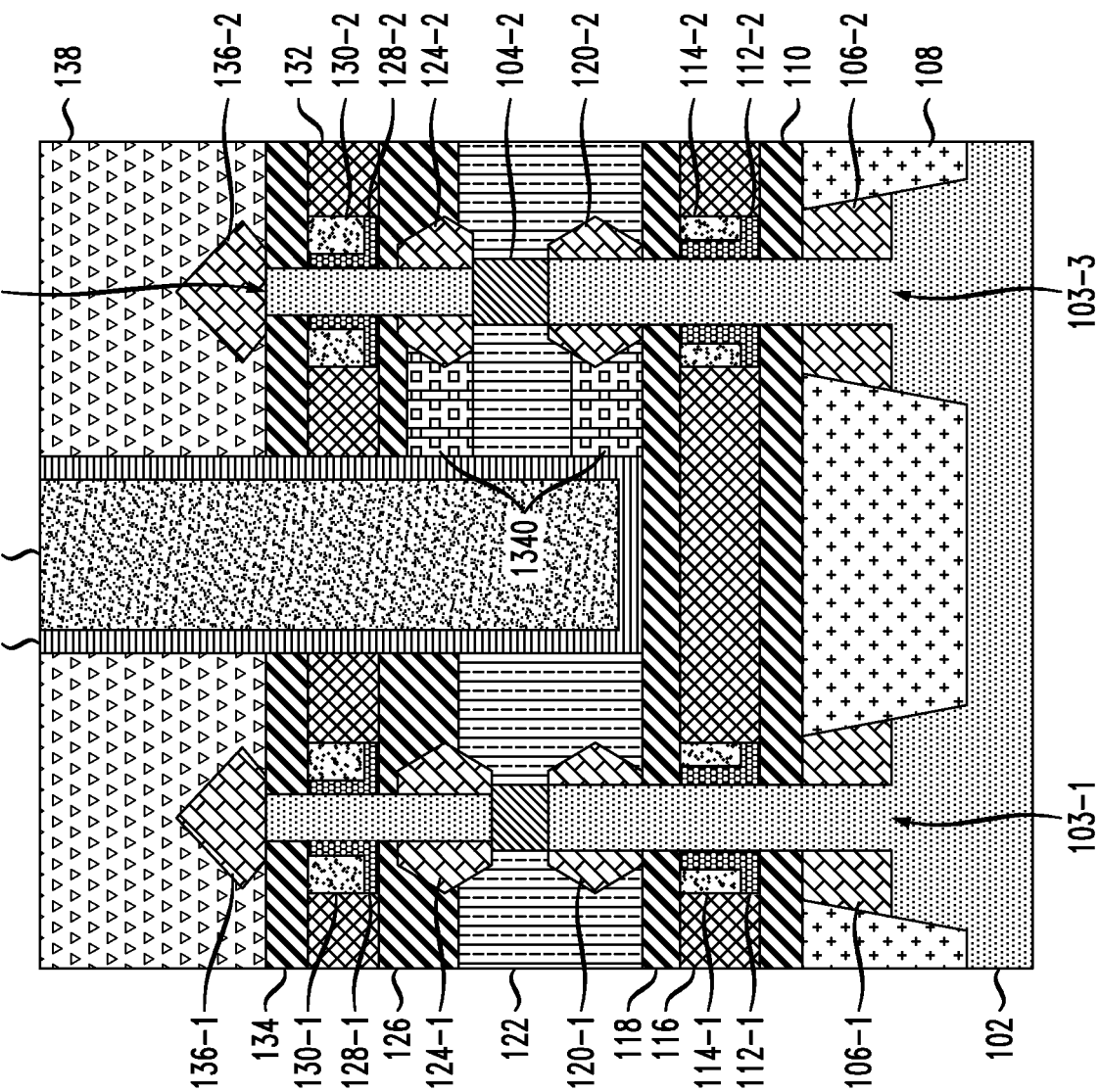
FIG. 13 depicts a cross-sectional view of the FIG. 12 structure following formation of contacts, according to an embodiment of the invention.

FIG. 12 shows a cross-sectional view 1200 of a starting structure that is similar to that of FIG. 1, though in the FIG. 12 structure the sacrificial layer 127 is replaced with a sacrificial layer 1227 that contacts only the bottom source/drain region 124-2 of one of the upper VTFETs rather than both of the bottom source/drain regions 124 for both of the upper VTFETs. FIG. 13 shows a cross-sectional view 1300 of the FIG. 12 structure after processing similar to that described above with respect to FIGS. 2-7, though in this instance the contact liner 1340 is only formed in one "side" of the region 203 (e.g., in the space formed by removal of the sacrificial layer 1227) to contact only the bottom source/drain region 124-2 of one of the upper VTFETs, and the barrier layer 1342 and contact material 1344 fill the space as illustrated.

Again, it should be appreciated that FIGS. 1-13 are presented to show examples of MOL contact formation for stacked VTFET structures. The particular numbers of bottom and top source/drain regions that are contacted in a particular embodiment may vary as desired based on the type of structure that is to be formed. For example, as noted above FIG. 1-7 illustrate the formation of an output contact for a NAND logic gate. To form other types of logic gates using stacked VTFET structures, other combination of the bottom and top source/drain regions of the upper and lower VTFET structures may include shared contacts.

In some embodiments, a method of forming a semiconductor structure comprises forming a stacked VTFET structure comprising one or more vertical fins each comprising a first semiconductor layer providing a vertical transport channel for a lower VTFET, an isolation layer over the first semiconductor layer, and a second semiconductor layer over the isolation layer providing a vertical transport channel for an upper VTFET. The method also comprises forming at least one vertical via in the stacked VTFET structure, the at least one vertical via being spaced apart from the one or more vertical fins of the stacked VTFET structure. The method further comprises forming at least one horizontal via extending from the at least one vertical via to at least one source/drain region of at least one of the upper and lower VTFETs of the stacked VTFET structure. The method further comprises forming a contact liner in the at least one horizontal via, forming a barrier layer on sidewalls of the at least one vertical via and on sidewalls of the contact liner, and forming a contact material over the barrier layer in the at least one vertical via.

Forming the at least one vertical via may comprise patterning a mask layer to expose a portion of a top surface of the stacked VTFET, the exposed portion of the top surface being spaced apart from the one or more vertical fins of the stacked VTFET structure, and etching the stacked VTFET to expose sidewalls of one or more sacrificial layers disposed adjacent the at least one source/drain region. Forming the at least one horizontal via may comprise removing the one or more sacrificial layers.

Forming the contact liner may comprise depositing the contact liner using a conformal deposition process to pinch off a space formed by the at least one horizontal via, and etching back the contact liner to remove portions of the contact liner formed on a bottom surface of the at least one vertical via, the sidewalls of the at least one vertical via, and a top surface of the stacked VTFET structure. The contact liner may comprise at least one of Ti, Ni, Co, and Pt. Forming the barrier layer may comprise depositing the barrier layer using a conformal deposition process. The barrier layer may comprise TiN. Forming the contact material over the barrier layer in the at least one vertical via may comprise filling the contact material, and planarizing the contact material and the barrier layer to the top surface of the stacked VTFET structure. The contact material may comprise at least one of W and Co.

Forming the at least one horizontal via may comprise forming a first horizontal via extending from the at least one vertical via to a first top source/drain region for a lower VTFET of a first one of the one or more vertical fins, forming a second horizontal via extending from the at least one vertical via to a first bottom source/drain region of an upper VTFET of the first vertical fin, and forming a third horizontal via extending from the at least vertical via to a second bottom source/drain region of an upper VTFET of a second one of the one or more vertical fins. The contact liner and the contact material may provide a shared output contact for a NAND logic gate.

Forming the stacked VTFET structure may further comprise forming one or more first bottom source/drain regions for the one or more lower VTFETs surrounding a first portion of the first semiconductor layer of the one or more vertical fins, forming a STI layer surrounding the one or more first bottom source/drain regions, forming a first bottom spacer over the one or more first bottom source/drain regions and the STI layer and surrounding a second portion of the first semiconductor layer of the one or more vertical fins, forming one or more first gate stacks for the one or more lower VTFETs over the first bottom spacer surrounding a third portion of the first semiconductor layer of the one or more vertical fins, forming a first ILD over the first bottom spacer surrounding the one or more first gate stacks, forming a first top spacer over the first ILD surrounding a fourth portion of the first semiconductor layer of the one or more vertical fins, forming one or more first top source/drain regions for the one or more lower VTFETs over the first top spacer surrounding a fifth portion of the first semiconductor layer of the one or more vertical fins, and forming a second ILD over the first top spacer and surrounding the one or more first top source/drain regions and the isolation layer of the one or more vertical fins.

Forming the stacked VTFET may further comprise forming one or more second bottom source/drain regions for the one or more upper VTFETs surrounding a first portion of the second semiconductor layer of the one or more vertical fins, forming a third ILD surrounding the one or more second bottom source/drain regions and a second portion of the second semiconductor layer of the one or more vertical fins, forming one or more second gate stacks for the one or more upper VTFETs surrounding a third portion of the second semiconductor layer of the one or more vertical fins, forming a fourth ILD surrounding the one or more second gate stacks, forming a second top spacer over the one or more second gate stacks and the fourth ILD and surrounding a third portion of the second semiconductor layer of the one or more vertical fins, forming one or more second top source/drain regions over a top surface of the second semiconductor layer of the one or more vertical fins, and forming a fifth ILD over the second top spacer and surrounding the one or more second top source/drain regions.

In some embodiments, a semiconductor structure comprises a stacked VTFET comprising one or more vertical fins each comprising a first semiconductor layer providing a vertical transport channel for a lower VTFET, an isolation layer over the first semiconductor layer, and a second semiconductor layer over the isolation layer providing a vertical transport channel for an upper VTFET. The semiconductor structure also comprises at least one vertical via in the stacked VTFET, the at least one vertical via being spaced apart from the one or more vertical fins of the stacked VTFET. The semiconductor structure further comprises at least one horizontal via extending from the at least one vertical via to at least one source/drain region of at least one of the upper and lower VTFETs of the stacked VTFET structure, a contact liner disposed in the at least one horizontal via, a barrier layer disposed on sidewalls of the contact liner and the at least one vertical via, and a contact material disposed over the barrier layer in the at least one vertical via.

The at least one horizontal via may comprise a first horizontal via extending from the at least one vertical via to a first top source/drain region for a lower VTFET of a first one of the one or more vertical fins, a second horizontal via extending from the at least one vertical via to a first bottom source/drain region of an upper VTFET of the first vertical fin, and a third horizontal via extending from the at least vertical via to a second bottom source/drain region of an upper VTFET of a second one of the one or more vertical fins. The contact liner and the contact material may provide a shared output contact for a NAND logic gate.

The semiconductor structure may further comprise one or more first bottom source/drain regions for the one or more lower VTFETs surrounding a first portion of the first semiconductor layer of the one or more vertical fins, a STI layer surrounding the one or more first bottom source/drain regions, a first bottom spacer disposed over the one or more first bottom source/drain regions and the STI layer and surrounding a second portion of the first semiconductor layer of the one or more vertical fins, one or more first gate stacks for the one or more lower VTFETs disposed over the first bottom spacer surrounding a third portion of the first semiconductor layer of the one or more vertical fins, a first ILD disposed over the first bottom spacer surrounding the one or more first gate stacks, a first top spacer disposed over the first ILD surrounding a fourth portion of the first semiconductor layer of the one or more vertical fins, one or more first top source/drain regions for the one or more lower VTFETs disposed over the first top spacer surrounding a fifth portion of the first semiconductor layer of the one or more vertical fins, and a second ILD disposed over the first top spacer and surrounding the one or more first top source/drain regions and the isolation layer of the one or more vertical fins.

The semiconductor structure may further comprise one or more second bottom source/drain regions for the one or more upper VTFETs surrounding a first portion of the second semiconductor layer of the one or more vertical fins, a third ILD surrounding the one or more second bottom source/drain regions and a second portion of the second semiconductor layer of the one or more vertical fins, one or more second gate stacks for the one or more upper VTFETs surrounding a third portion of the second semiconductor layer of the one or more vertical fins, a fourth ILD surrounding the one or more second gate stacks, a second top spacer disposed over the one or more second gate stacks and the fourth ILD and surrounding a third portion of the second semiconductor layer of the one or more vertical fins, one or more second top source/drain regions disposed over a top surface of the second semiconductor layer of the one or more vertical fins, and a fifth ILD disposed over the second top spacer and surrounding the one or more second top source/drain regions.

In some embodiments, an integrated circuit comprises a stacked VTFET structure comprising one or more vertical fins each comprising a first semiconductor layer providing a vertical transport channel for a lower VTFET, an isolation layer over the first semiconductor layer, and a second semiconductor layer over the isolation layer providing a vertical transport channel for an upper VTFET. The stacked VTFET structure also comprises at least one vertical via spaced apart from the one or more vertical fins, at least one horizontal via extending from the at least one vertical via to at least one source/drain region of at least one of the upper and lower VTFETs, a contact liner disposed in the at least one horizontal via, a barrier layer disposed on sidewalls of the contact liner and the at least one vertical via, and a contact material disposed over the barrier layer in the at least one vertical via.

The at least one horizontal via may comprise a first horizontal via extending from the at least one vertical via to a first top source/drain region for a lower VTFET of a first one of the one or more vertical fins, a second horizontal via extending from the at least one vertical via to a first bottom source/drain region of an upper VTFET of the first vertical fin, and a third horizontal via extending from the at least vertical via to a second bottom source/drain region of an upper VTFET of a second one of the one or more vertical fins.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;
   forming at least one vertical via in the stacked vertical transport field-effect transistor structure, the at least one vertical via being spaced apart from the one or more vertical fins of the stacked vertical transport field-effect transistor structure;
   forming at least one horizontal via extending from the at least one vertical via to at least one source/drain region of at least one of the upper and lower vertical transport field-effect transistors of the stacked vertical transport field-effect transistor structure;
   forming a contact liner in the at least one horizontal via;
   forming a barrier layer on sidewalls of the at least one vertical via and on sidewalls of the contact liner, wherein the barrier layer comprises an electrically conducting material; and
   forming a contact material over the barrier layer in the at least one vertical via.

2. The method of claim 1, wherein forming the at least one vertical via comprises:
   patterning a mask layer to expose a portion of a top surface of the stacked vertical transport field-effect transistor, the exposed portion of the top surface being spaced apart from the one or more vertical fins of the stacked vertical transport field-effect transistor structure; and
   etching the stacked vertical transport field-effect transistor to expose sidewalls of one or more sacrificial layers disposed adjacent the at least one source/drain region.

3. The method of claim 2, wherein forming the at least one horizontal via comprises removing the one or more sacrificial layers.

4. The method of claim 1, wherein forming the contact liner comprises:
   depositing the contact liner using a conformal deposition process to pinch off a space formed by the at least one horizontal via; and
   etching back the contact liner to remove portions of the contact liner formed on a bottom surface of the at least one vertical via, the sidewalls of the at least one vertical via, and a top surface of the stacked vertical transport field-effect transistor structure.

5. The method of claim 4, wherein the contact liner comprises at least one of titanium, nickel, cobalt and platinum.

6. The method of claim 4, wherein forming the barrier layer comprises depositing the barrier layer using a conformal deposition process.

7. The method of claim 6, wherein the barrier layer comprises titanium nitride.

8. The method of claim 6, wherein forming the contact material over the barrier layer in the at least one vertical via comprises:
filling the contact material; and
planarizing the contact material and the barrier layer to the top surface of the stacked vertical transport field-effect transistor structure.

9. The method of claim 8, wherein the contact material comprises at least one of tungsten and cobalt.

10. The method of claim 1, wherein forming the at least one horizontal via comprises:
forming a first horizontal via extending from the at least one vertical via to a first top source/drain region for a lower vertical transport field-effect transistor of a first one of the one or more vertical fins;
forming a second horizontal via extending from the at least one vertical via to a first bottom source/drain region of an upper vertical transport field-effect transistor of the first vertical fin; and
forming a third horizontal via extending from the at least vertical via to a second bottom source/drain region of an upper vertical transport field-effect transistor of a second one of the one or more vertical fins.

11. The method of claim 10, wherein the contact liner and the contact material provide a shared output contact for a NAND logic gate.

12. The method of claim 1, wherein forming the stacked vertical transport field-effect transistor structure further comprises:
forming one or more first bottom source/drain regions for the one or more lower vertical transport field-effect transistors surrounding a first portion of the first semiconductor layer of the one or more vertical fins;
forming a shallow trench isolation layer surrounding the one or more first bottom source/drain regions;
forming a first bottom spacer over the one or more first bottom source/drain regions and the shallow trench isolation layer and surrounding a second portion of the first semiconductor layer of the one or more vertical fins;
forming one or more first gate stacks for the one or more lower vertical transport field-effect transistors over the first bottom spacer surrounding a third portion of the first semiconductor layer of the one or more vertical fins;
forming a first interlayer dielectric over the first bottom spacer surrounding the one or more first gate stacks;
forming a first top spacer over the first interlayer dielectric surrounding a fourth portion of the first semiconductor layer of the one or more vertical fins;
forming one or more first top source/drain regions for the one or more lower vertical transport field-effect transistors over the first top spacer surrounding a fifth portion of the first semiconductor layer of the one or more vertical fins; and forming a second interlayer dielectric over the first top spacer and surrounding the one or more first top source/drain regions and the isolation layer of the one or more vertical fins.

13. The method of claim 12, wherein forming the stacked vertical transport field-effect transistor further comprises:
forming one or more second bottom source/drain regions for the one or more upper vertical transport field-effect transistors surrounding a first portion of the second semiconductor layer of the one or more vertical fins;
forming a third interlayer dielectric surrounding the one or more second bottom source/drain regions and a second portion of the second semiconductor layer of the one or more vertical fins;
forming one or more second gate stacks for the one or more upper vertical transport field-effect transistors surrounding a third portion of the second semiconductor layer of the one or more vertical fins;
forming a fourth interlayer dielectric surrounding the one or more second gate stacks;
forming a second top spacer over the one or more second gate stacks and the fourth interlayer dielectric and surrounding a third portion of the second semiconductor layer of the one or more vertical fins;
forming one or more second top source/drain regions over a top surface of the second semiconductor layer of the one or more vertical fins; and
forming a fifth interlayer dielectric over the second top spacer and surrounding the one or more second top source/drain regions.

14. A semiconductor structure, comprising:
a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;
at least one vertical via in the stacked vertical transport field-effect transistor structure, the at least one vertical via being spaced apart from the one or more vertical fins of the stacked vertical transport field-effect transistor structure;
at least one horizontal via extending from the at least one vertical via to at least one source/drain region of at least one of the upper and lower vertical transport field-effect transistors of the stacked vertical transport field-effect transistor structure;
a contact liner disposed in the at least one horizontal via;
a barrier layer disposed on sidewalls of the contact liner and the at least one vertical via, wherein the barrier layer comprises an electrically conducting material; and
a contact material disposed over the barrier layer in the at least one vertical via.

15. The semiconductor structure of claim 14, wherein the at least one horizontal via comprises:
a first horizontal via extending from the at least one vertical via to a first top source/drain region for a lower vertical transport field-effect transistor of a first one of the one or more vertical fins;
a second horizontal via extending from the at least one vertical via to a first bottom source/drain region of an upper vertical transport field-effect transistor of the first vertical fin; and a third horizontal via extending from the at least vertical via to a second bottom source/drain region of an upper vertical transport field-effect transistor of a second one of the one or more vertical fins.

16. The semiconductor structure of claim 15 wherein the contact liner and the contact material provide a shared output contact for a NAND logic gate.

17. The semiconductor structure of claim 14, further comprising:
one or more first bottom source/drain regions for the one or more lower vertical transport field-effect transistors surrounding a first portion of the first semiconductor layer of the one or more vertical fins;
a shallow trench isolation layer surrounding the one or more first bottom source/drain regions;
a first bottom spacer disposed over the one or more first bottom source/drain regions and the shallow trench isolation layer and surrounding a second portion of the first semiconductor layer of the one or more vertical fins;
one or more first gate stacks for the one or more lower vertical transport field-effect transistors disposed over the first bottom spacer surrounding a third portion of the first semiconductor layer of the one or more vertical fins;
a first interlayer dielectric disposed over the first bottom spacer surrounding the one or more first gate stacks;
a first top spacer disposed over the first interlayer dielectric surrounding a fourth portion of the first semiconductor layer of the one or more vertical fins;
one or more first top source/drain regions for the one or more lower vertical transport field-effect transistors disposed over the first top spacer surrounding a fifth portion of the first semiconductor layer of the one or more vertical fins; and
a second interlayer dielectric disposed over the first top spacer and surrounding the one or more first top source/drain regions and the isolation layer of the one or more vertical fins.

18. The semiconductor structure of claim 17, further comprising:
one or more second bottom source/drain regions for the one or more upper vertical transport field-effect transistors surrounding a first portion of the second semiconductor layer of the one or more vertical fins;
a third interlayer dielectric surrounding the one or more second bottom source/drain regions and a second portion of the second semiconductor layer of the one or more vertical fins;
one or more second gate stacks for the one or more upper vertical transport field-effect transistors surrounding a third portion of the second semiconductor layer of the one or more vertical fins;
a fourth interlayer dielectric surrounding the one or more second gate stacks;
a second top spacer disposed over the one or more second gate stacks and the fourth interlayer dielectric and surrounding a third portion of the second semiconductor layer of the one or more vertical fins;
one or more second top source/drain regions disposed over a top surface of the second semiconductor layer of the one or more vertical fins; and
a fifth interlayer dielectric disposed over the second top spacer and surrounding the one or more second top source/drain regions.

19. An integrated circuit comprising:
a stacked vertical transport field-effect transistor structure comprising:
one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;
at least one vertical via spaced apart from the one or more vertical fins;
at least one horizontal via extending from the at least one vertical via to at least one source/drain region of at least one of the upper and lower vertical transport field-effect transistors;
a contact liner disposed in the at least one horizontal via;
a barrier layer disposed on sidewalls of the contact liner and the at least one vertical via, wherein the barrier layer comprises an electrically conducting material; and
a contact material disposed over the barrier layer in the at least one vertical via.

20. The integrated circuit of claim 19, wherein the at least one horizontal via comprises:
a first horizontal via extending from the at least one vertical via to a first top source/drain region for a lower vertical transport field-effect transistor of a first one of the one or more vertical fins;
a second horizontal via extending from the at least one vertical via to a first bottom source/drain region of an upper vertical transport field-effect transistor of the first vertical fin; and
a third horizontal via extending from the at least vertical via to a second bottom source/drain region of an upper vertical transport field-effect transistor of a second one of the one or more vertical fins.

* * * * *